United States Patent [19]
Bräuer et al.

[11] Patent Number: 5,372,693
[45] Date of Patent: Dec. 13, 1994

[54] VACUUM COATING APPARATUS

[75] Inventors: Günter Bräuer, Freigericht; Ulrich Patz, Linsengericht; Michael Scherer, Rodenbach; Joachim Szczyrbowski, Goldbach, all of Germany

[73] Assignee: Leybold Aktiengesellschaft, Hanau, Germany

[21] Appl. No.: 213,874

[22] Filed: Mar. 16, 1994

[30] Foreign Application Priority Data

Apr. 23, 1993 [DE] Germany ............... 4313353

[51] Int. Cl.⁵ ................................ C23C 14/34
[52] U.S. Cl. .................. 204/298.11; 204/298.15; 204/298.23; 204/298.25; 204/298.28
[58] Field of Search ............ 204/298.11, 298.15, 204/298.12, 298.23, 298.25, 298.26, 298.28

[56] References Cited

U.S. PATENT DOCUMENTS

| | | | |
|---|---|---|---|
| 4,416,759 | 11/1983 | Harra et al. | 204/298.11 |
| 4,450,062 | 5/1984 | Macaulay | 204/298.11 |
| 4,514,275 | 4/1985 | Shimada et al. | 204/298 |
| 4,986,890 | 1/1991 | Setoyama et al. | 204/298.11 X |
| 5,254,236 | 10/1993 | Kinokiri et al. | 204/298.11 |

FOREIGN PATENT DOCUMENTS 1063612 3/1967 United Kingdom .

Primary Examiner—Nam Nguyen
Attorney, Agent, or Firm—Felfe & Lynch

[57] ABSTRACT

A vacuum coating apparatus has a pot-like tank (2) against whose open side a portion of a substrate (1) can be held sealingly. In the tank (2) there is disposed a target (7). A shut-off plate (9) makes it possible after lowering the substrate (1) to hold this target (7) under vacuum in a source chamber (11) protected against intrusion of air.

4 Claims, 1 Drawing Sheet

VACUUM COATING APPARATUS

BACKGROUND OF THE INVENTION

The invention relates to a vacuum coating apparatus for coating an area on a substrate by means of a sputtering cathode with a target, which is the coating source, and which is disposed within a tank configured as a pot with an open side which can be placed sealingly on a substrate.

A vacuum coating apparatus of the kind described is the subject of U.S. Pat. No. 4,514,275. In such a coating apparatus, in order to coat a local area on a substrate of large area, the tank does not have to have a capacity so great that it can accommodate the entire substrate, since the substrate forms only part of the wall of the tank. All it needs is a cross section slightly larger than the area to be coated. Consequently the known vacuum coating apparatus is very compact. It is especially suited to the application of a sensor coating to the window of a motor vehicle.

In vacuum coating apparatus in which the coating source is a sputtering cathode with a target, it often occurs that the target easily reacts with components of the atmosphere, so that it must not become exposed to the atmosphere. This, however, cannot be avoided in the known vacuum coating apparatus because, after the tank and target are separated the atmosphere can flow through the then-open side into the tank in the form of a pot.

The invention is addressed to the problem of constructing a vacuum coating apparatus of the kind described above so that even targets which react easily with components of the air can be used as vaporizing material.

SUMMARY OF THE INVENTION

In accordance with the invention the tank is divided by a plate that can be shifted sealingly in front of the coating source into a source chamber and a substrate chamber. In such a vacuum coating apparatus, before the substrate is removed from the pot, that is, before the air can enter into the pot, the part of the pot in which the target is situated can be sealed off from the part containing the substrate.

The separation of the source chamber can be achieved structurally in an especially simple manner if the shut-off plate is held by a shaft rotatably disposed on one side of the pot and is made so as to be moved sealingly into the pot.

The source chamber can be made especially compact in size if, according to another embodiment of the invention, the sputtering cathode is held in the pot so as to be movable toward the substrate.

Different coatings can be applied in rapid succession if, according to another embodiment of the invention a changing device having at least two different coating sources is provided in the pot. With such a changing device different process steps can be performed, e.g., etching with an ion source, heating to incandescence, HF and DC processes, reactive and nonreactive processes, or PECVD processes.

The invention is susceptible of numerous embodiments. For the further explanation of its basic principle one of them and a modified detail thereof are represented in the drawing and are described below.

DETAILED DESCRIPTION OF THE PREFERRED EMBODIMENT

Figure 1:
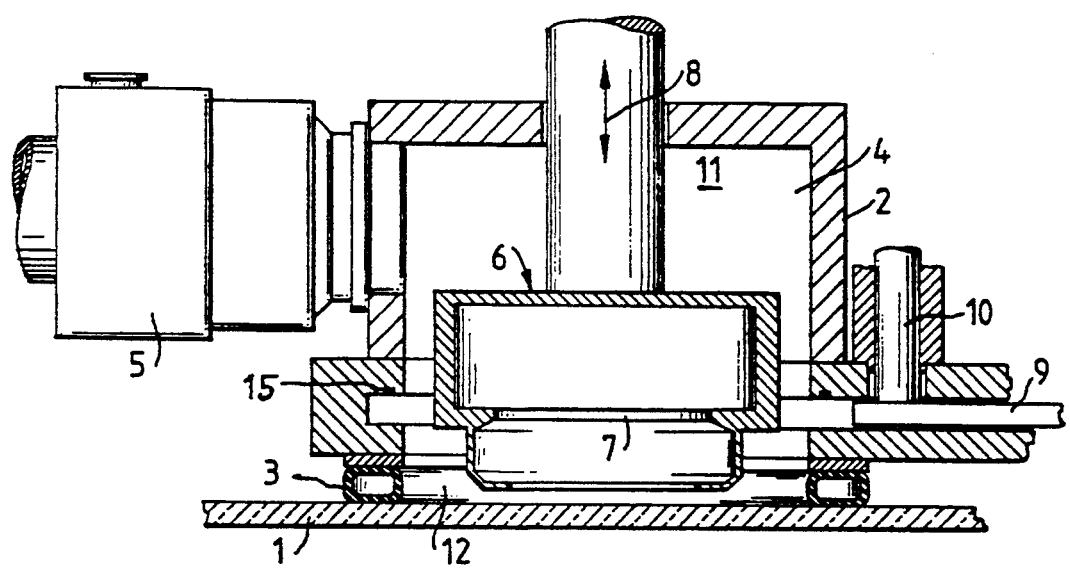
FIG. 1 is a vertical section through a vacuum coating apparatus according to the invention.

FIG. 1 shows a substrate 1 which is a windowpane of a motor vehicle, onto which the open end of a tank 2 configured as a pot is set down. A circumferential gasket 3 seals the tank 2 against the substrate. In this manner a vacuum chamber 4 is created, which is defined by the tank 2 and by the substrate 1 on its bottom as seen in the figure. A turbomolecular pump 5, flange-mounted directly on the tank 2, serves for the evacuation of the vacuum chamber 4. In the tank 2 there is provided a coating source 6, which in this embodiment is a sputtering apparatus with a target 7. The double arrow 8 indicates that the coating source 6 with its target 7 can be set at a greater or lesser distance from the substrate 1. When the coating source 6 is in its uppermost position, a shut-off plate 9, which is mounted on a rotatable shaft 10, can be swung into the tank 2 sealingly beneath the coating source 6. This shut-off plate 9 then divides the tank 2 into a source chamber 11 above the shut-off plate 9 and a substrate chamber 12 beneath the shut-off plate 9. When the substrate 1 is removed, the plate 9 is pressed against circumferential seal 15 in the wall of tank 2 by the pressure differential between the atmospheric pressure in substrate chamber 12 and the vacuum in the source chamber 11.

Figure 2:
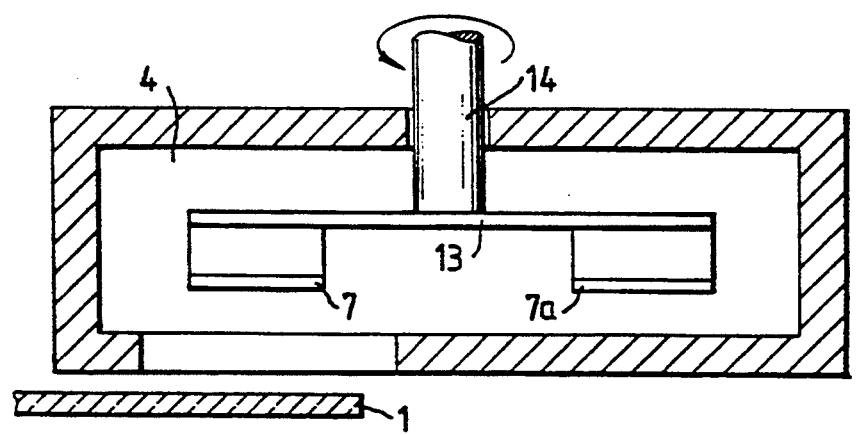
FIG. 2 is a vertical section through a modified detail of the apparatus of FIG. 1.

In FIG. 2 a changing device 13 is disposed in the vacuum chamber 4; in this example is configured as a carousel bearing two different targets 7 and 7a. When it is rotated by a shaft 14 the particularly desired target 7 or 7a can be brought into a position adjacent to the substrate 1, so that different coatings can be sputtered onto it.

We claim:

1. Vacuum coating apparatus for coating an area of a substrate, comprising
   a tank having an opening which can be placed against a substrate,
   a sealing means for sealing said opening against said substrate,
   a coating source comprising a target-bearing sputtering cathode in said tank,
   a shut-off wall which can be moved between said coating source and said opening to divide said tank into a source chamber and a substrate chamber, and sealing means which cooperates with said shut-off wall for sealing said source chamber from said substrate chamber.

2. Vacuum coating apparatus as in claim 1 further comprising a rotatable shaft outside said tank, said shut-off wall being fixed to said shaft.

3. Vacuum coating apparatus as in claim 1 wherein said coating source is movable toward said opening.

4. Vacuum coating apparatus as in claim 1 wherein said coating source comprises two target bearing sputtering cathodes which can be moved alternately to a position adjacent said opening.

* * * * *